Dec. 5, 1967 H. F. RIETH 3,356,972

TELEVISION RECEIVING SET TUNING MECHANISM

Filed March 26, 1965 3 Sheets-Sheet 1

INVENTOR.
Harold F. Rieth

By Smyth, Roston & Pavitt
Attorneys

INVENTOR.
Harold F. Rieth
By Smyth, Roston & Pavitt
Attorneys

INVENTOR.
Harold F. Rieth
By Smyth, Roston & Pavitt
Attorneys

United States Patent Office 3,356,972

Patented Dec. 5, 1967

3,356,972

TELEVISION RECEIVING SET TUNING MECHANISM

Harold F. Rieth, Santa Monica, Calif., assignor to Packard-Bell Electronics Corporation, Los Angeles, Calif., a corporation of California Filed Mar. 26, 1965, Ser. No. 442,924
15 Claims. (Cl. 334—49)

This invention relates to television receiving sets and more particularly to an improved tuning mechanism for use therein.

Most television tuners presently in use have their tuning circuit components mounted on fixed Bakelite wafers, usually three or more in number, mounted parallel to each other with a rotatable shaft running through. The shaft is rotatable either by hand or by a motor for remote control of the television receiver tuning and carries electrical contacts that switch various of the components on the fixed wafers in and out of the television circuitry in order to tune the television receiver to a selected one of the very high frequency (VHF) or ultra-high frequency (UHF) channels. Such "parallel wafer" television tuners are generally at least four inches long (not including the added three or more inches contributed by a coaxial remote control tuning motor) and are thus not easily incorporated into the new thin television receivers being designed for wall hanging and the ike. Moreover, the parallel wafers are so close to each other that extensive heavy shielding is necessary to avoid electrical interference between components on one wafer and components on adjacent wafers, The closeness of the wafers when mounted in the tuner and the shielding between wafers make wafer components inaccessible for removal or adjustment once the tuner is assembled. In the past, this has meant that any manufacturing error or later breakdown required the disassembly of the entire tuner—a process so time-consuming and expensive that most television set manufacturers have been unable to produce their own tuners and thus have been forced to relay upon suppliers specially skilled in assembling in this component.

Another difficulty posed by the parallel wafer tuner or any other type using a central shaft is the stray signal problem: the tendency of receivers to impress spurious signals upon their antennae and thus to interfere with the reception of nearby sets. One of the most difficult problems in TV receiver design is that of keeping stray signal radiation within F.C.C. specifications. Because the television tuner is directly connected to the receiver antenna, it is the source of approximately 75% of all stray signal interference. Although extensive shielding is used in most tuners, this is far from being a perfect solution, especially in UHF applications, because the rotatable shaft runs through all the shields for the length of the tuner. Attempts to ground the central shaft have never proved successful, due to inadequate or impermanent coupling.

Therefore, applicant's invention provides an improved television receiving set tuner consisting of rotatable wafers made of Bakelite or some other insulator. The wafers are made circular with geared peripheries; so that when mounted coplanar and with gears meshing, they will rotate together. Most of the electrical components of the tuner circuitry may be mounted on the rotating wafers while the central shaft or adjacent supporting structure of each wafer carries fixed contacts which are switched into and out of connections with the various electrical components as the wafer and/or shaft is rotated.

The arrangement of the geared wafers relative to each other is purely a matter of the design requirements of each specific application: they may be coplanar or otherwise and may be strung out in a line or clustered as closely together as possible; and any manual actuator or remote control motor may be directly connected coaxially with or geared to any desired wafer.

Especially in combined VHF–UHF tuners, wafers may be mounted parallel to each other, either coaxially or otherwise, and may be connected to rotate together or left free (as when mounted on separate but coaxial shafts). In UHF tuner design, the present invention has proved especially fortunate because the great number of UHF channels makes very fine continuous tuning essential; yet prior art single-shaft tuners are too resistant to turning for exact location of a desired UHF channel, unless separate UHF and VHF shafts are used. This is especially true where gearing is used, due to gear backlash; the wide diameter peripheries of the tuner wafers, on the other hand, minimize the backlash effect of gears thereon.

Applicant's geared wafer tuner makes its greatest improvement to the overall receiver set by eliminating the central shaft of prior art tuners, thus removing the main conduit of tuner stray signal interference. Since the central shaft was the predominant design obstacle in stray signal minimization, its removal minimizes design problems in that area. Moreover, the RF interference between tuner electronic components will not be as great where the wafers are lying adjacent and coplanar as where they are parallel-stacked, and the area of shielding required is less: merely a small barrier between the ends of intermeshing wafers, as against the prior art need for two parallel shields exceeding the area of the wafer being insulated.

Since there is no limit as to the size of any wafer in applicant's geared tuner, another advantage arises: as many tuner components as desired can be mounted on the moving wafers so that contacts and wiring from wafer to fixed structures are held to a minimum. As another advantage, a tuner according to the instant invention permits shorter wiring leads, if only the receiver set is designed with the tuner flat against the other electronics.

The manufacture and subsequent maintenance of applicant's geared-wafer tuners represent an optimum of efficiency and simplicity, especially relative to the prior art inaccessibility. Due to their exposed position, entire individual wafers may be removed and replaced in minutes, or repair and adjustment can be done with the wafer in place. Likewise, in manufacture, the mounting of the components on the wafers can precede or follow the assembly of the wafers on the tuner chassis, and any changes for check-out or quality control purposes are easily accomplished. Thus, expertise and specialization in tuner manufacture are no longer at a premium, and tuner prime costs will be cut substantially.

Other objects and features of applicant's invention and a better understanding thereof may be had by referring to the following description and claims taken in conjunction with the accompanying drawings in which:

FIGURE 1*a* is a perspective view of a thin-designed television set using a tuner according to the prior art;

FIGURE 1*b* is a perspective view of a thin-designed television set using a tuner according to the present invention;

Figure 8:
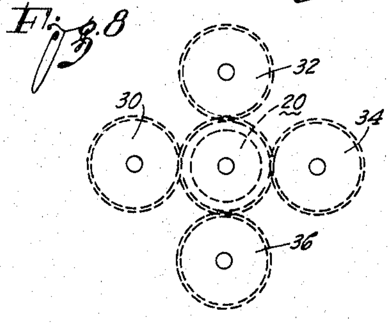
Figure 9:
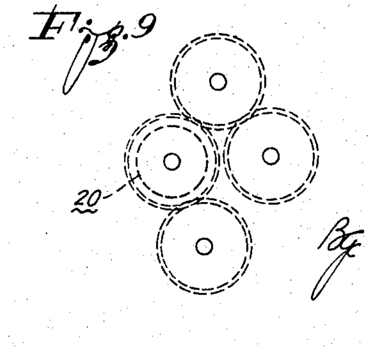
Figures 5, 6, 7:
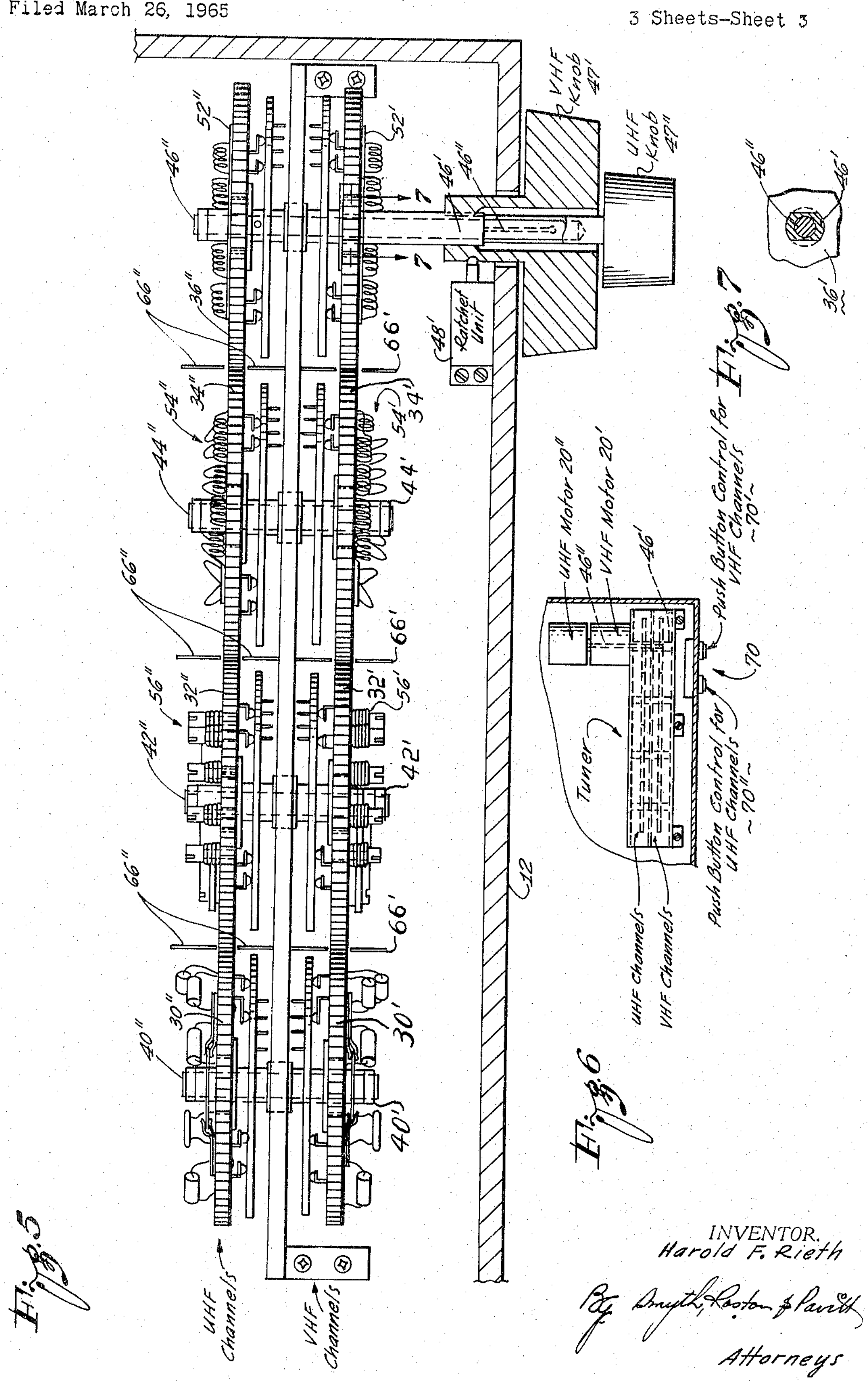
FIGURE 5 is a side elevation in section of a combined UHF-VHF tuner according to the principles of the instant invention.
FIGURE 6 is a schematic side elevation of a combined

VHF-UHF tuner in which remote control motors are incorporated;

FIGURE 7 is a detail plan elevation along section 7—7 of FIGURE 5;

FIGURE 8 is a plan elevation of a maximum wafer separation tuner according to the instant invention, and FIGURE 9 is a plan elevation of a maximum-compactness tuner according to the principles of the instant invention.

Figure 1A:
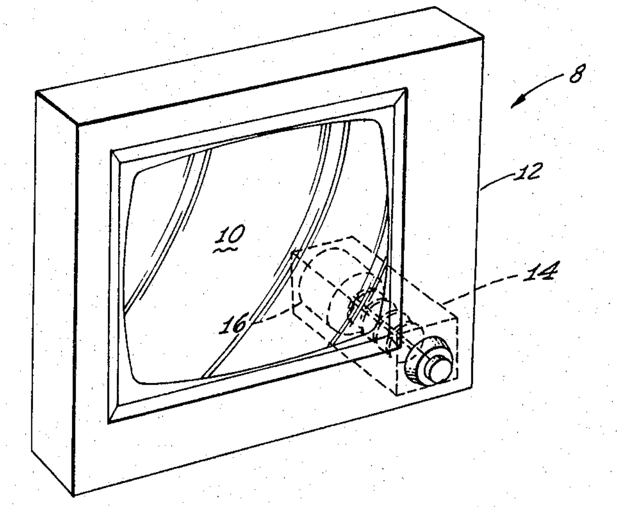
Fig. 1a (PRIOR ART)

Referring to FIGURE 1*a*, a thin-designed television receiver 8 is shown in which a tuner according to the principles of the instant invention may be used. By way of illustration, the television receiver may include a picture tube 10 approximately 3 inches thick and an outer cabinet 12 fitted accordingly. Thus, a tuner according to the prior design (parallel wafer or other type) as shown in outline at 14 would extend beyond the back of the cabinet 12 even without the additional length required for a remote tuning motor 16. On the other hand, a tuner using coplanar rotating wafers according to the principles of the instant invention, as shown in outline at 18 of FIGURE 1*b* could easily be designed into the cabinet 12 with or without a parallel remote control tuning motor, as shown in outline at 20.

Figure 1B:
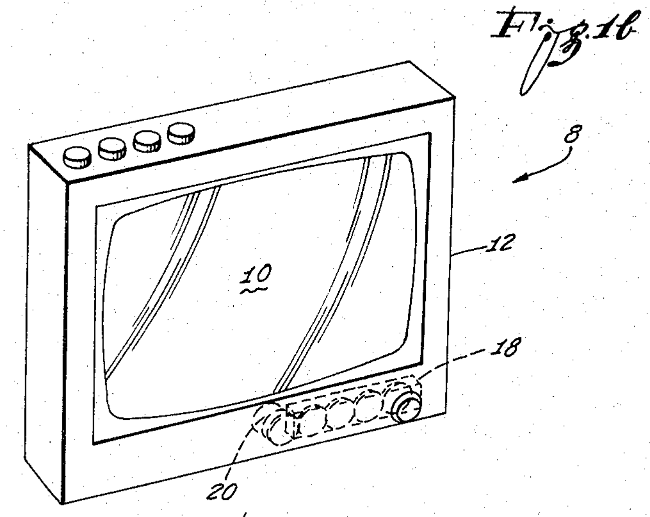
Figures 2, 3, 4:
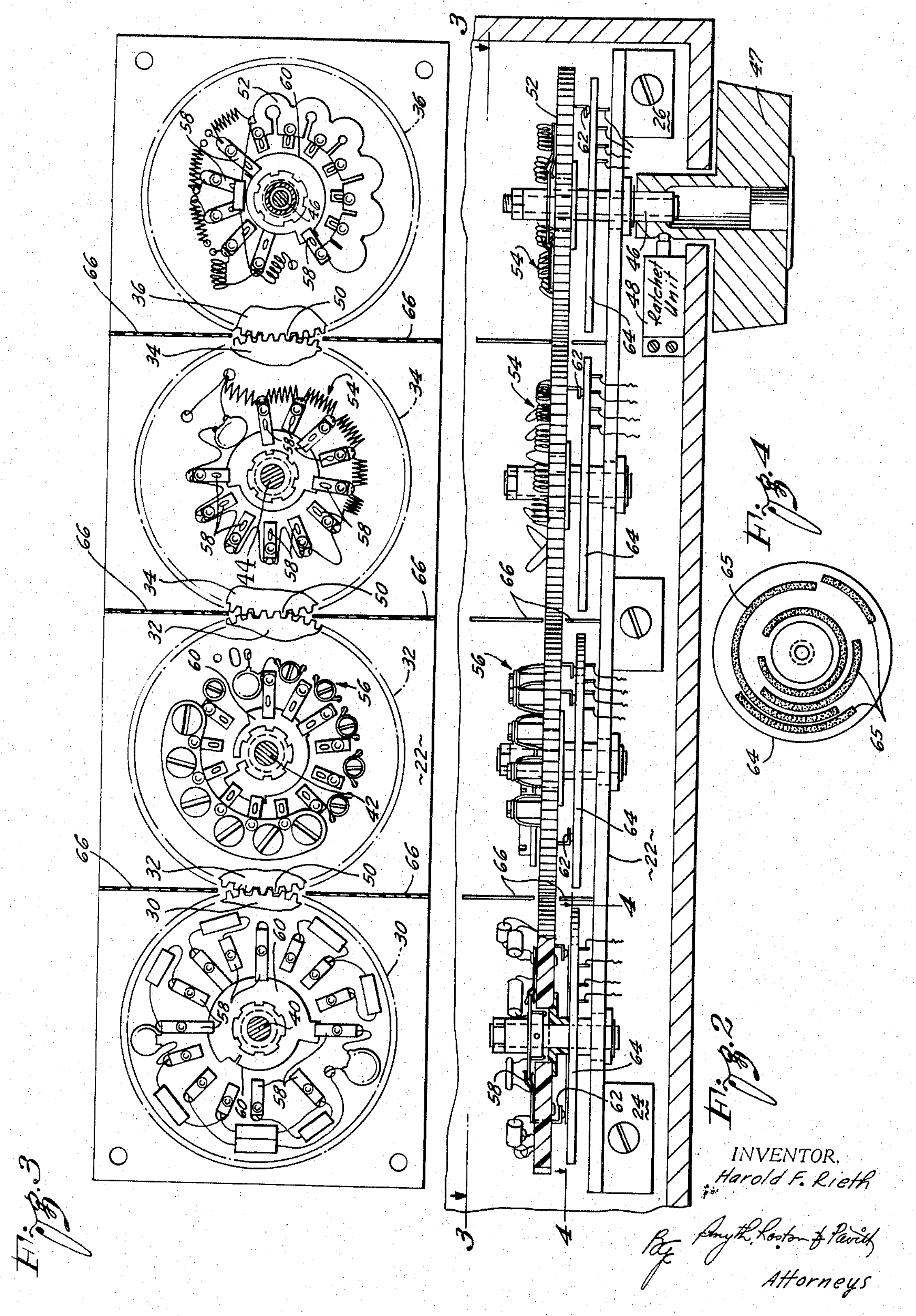
FIGURE 2 is a side elevation in cutaway of a television tuner according to the principles of the instant invention.
FIGURE 3 is a plan elevation along section 3—3 of FIGURE 2 of a television tuner according to the principles of the instant invention.
FIGURE 4 is a detail plan elevation along section 4—4 of FIGURE 2.

Referring to FIGURES 2 and 3, a tuner according to the principles of the instant invention has its base 22 affixed to brackets 24 and 26 on the cabinet 12 of a television receiver such as that shown in FIGURES 1*a* and 1*b*. Four wafers 30, 32, 34 and 36 are mounted on the base 22 and are rotatable with their respective shafts 40, 42, 44 and 46. Gears 50 on the periphery of each of the circular wafers intermesh with the gears of each adjacent wafer. In this particular design, the control knob 47 with its ratchet 48 is illustratively placed coaxial with the shaft 46 rather than having control means coplanar with the wafers 30–36.

The wafers 30–36 may carry inductors either flat-constructed, as shown at 52, or coil-wound and lying flat, as shown at 54, or coil-wound and held upright as shown at 56, the mode of construction and placement depending on the amount of inductance desired and the need for inuctive coupling with another inductance on a parallel wafer or elsewhere on the same wafer. In like manner, resistors, capacitors, and present-day compact active elements such as transistors, nuvistors, or micro circuits may be carried on any one of the wafers 30–36. Electrical interconnection between wafers and connection with circuitry outside the tuner may be accomplished by connection of contacts 58 on the wafer with a slide 60 on a fixed portion of one of the shafts 40–46 or by a similar connection of contacts 62 on the wafers 30–36 with a fixed or rotatable contact plate 64 having slides 65 (FIGURE 4) of any convenient design. Small shields 66 are adequate to prevent electrical interference between wafers, in contrast to the extensive and heavy parallel shielding required by parallel-wafer tuners in the prior art. The shields 66 are slotted to permit intermeshing of the wafer gears 50.

From the illustrative embodiment shown in FIGURES 2 and 3 (at approximately full scale), it can be seen that the large central shaft of the prior art tuner 14 has been eliminated and along with it the nagging problem of how to minimize stray signals. Shielding between wafers of the prior art parallel-wafer tuner 14 was only marginally effective because of the central shaft running through all the wafers; on the other hand, the shielding 66 in the tuner of FIGURES 2 and 3 has no structure running through it save the gears 50; and since they are made of Bakelite or some other non-conductive material, the overall shielding effect is nearly perfect. Moreover, the switch from coaxial wafers as at 14 to coplanar wafers according to the instant invention is a switch from minimum separation of electrical components on the different wafers to maximum separation. Thus, the interference between wafers and accumulation of signals therefrom on the receiver set antenna has been minimized as done by the instant invention. It is worth noting also that applicant's new tuner as shown in FIGURES 2 and 3 permits the use of far shorter leads between tuner components 52–56 and components outside the tuner structure, again helping to cut down high frequency interference within the overall circuitry of the receiver set.

Examination of FIGURES 2 and 3 will also show the advantages from the standpoint of manufacture and maintenance of having the component-bearing faces of the wafers 30–36 exposed. In the initial manufacture of a tuner according to FIGURES 2 and 3, the components 52–56 may be mounted on the wafers 30–36 and then the wafers 30–36 mounted on their shafts 40–46 on the base 22. Should the assembled tuner not function properly upon testing by quality control personnel, reworking and adjustment of the components 52–56 and their wiring may be accomplished without disassembling the tuner and in effect remanufacturing it. The same is true when repairs to the tuner become necessary later in its operating life. Moreover, in the tuner shown in FIGURES 2 and 3, the replacement of an entire wafer in order to correct malfunction would be a very simple matter. Thus, spare wafers could be carried in stock at the factory or distributor level and supplied to dealers and repairmen for immediate substitution for faulty wafers. Under this system, the "down time" of a television set could be cut to a matter of hours or even minutes, if the set is brought in to the repair shop, since the set could be put back in use while the repairs were being made on the malfunctioning part of the tuner.

FIGURE 5 shows a combined VHF-UHF tuner according to the principles of the instant invention and similar in design to the tuner of FIGURES 2 and 3, with the addition that the components shown there are duplicated: one set (prime numbers) for VHF and a second set (double prime numbers) for UHF. Thus, wafers 30′, 32′, 34′ are mounted on shafts 40′, 42′, 44′ and 46′ below the base 22 of the tuner of FIGURE 5, while wafers 30″, 32″, 34″ and 36″ are mounted on shafts 40″, 42″, 44″ and 46″ above the base 22. Shielding for both VHF and UHF components is shown at 66′ and 66″. The shafts 46′ and 46″ are concentric, the VHF shaft 46′ being hollow to permit passage of the UHF shaft 46″ therethrough. The VHF tuning knob 47′ is affixed to the shaft 46′, which is keyed to impart rotation to the wafer 36′ as shown in FIGURE 7. The shaft 46′-knob 47′ combination for tuning the VHF components 52′–56′ has a ratchet unit 48′ associated therewith to assure that rotation of knob 47′ stops at the center or optimum tuning point for each VHF channel. The UHF shaft 46″-knob 47″ combination does not have such a ratchet arrangement, because the great number of UHF channels (82 in present sets) makes continuous or "fine" tuning necessary.

The need for fine-tuning UHF channels gives rise to another advantage of applicant's new tuner concept, in that the friction on either knob 47′ or 47″ is far lighter than that on the central shaft of present parallel-wafer tuners. The presently required use of a strong turning force makes UHF tuning time-consuming and annoying.

The VHF-UHF unit of FIGURE 5 has the added advantage of permitting the UHF tuning components 52″–56“ and wafers 30″–36″ to be operated in the same tuner unit with the VHF components 30′–36′. Moreover, the VHF and UHF tuning knobs 47′ and 47″ can be mounted coaxially and yet be operated independently, so that frictional resistance is halved and the VHF shaft 46′ can be ratcheted while the UHF shaft 46′ is left free for fine tuning. In fact, applicant's tuner according to FIGURE 5 could have UHF and VHF knobs 47′ and 47″ divided into four: a VHF rough tuning control knob (ratcheted), a VHF fine tuning knob (unratcheted), a UHF rough tuning knob (ratcheted), and a UHF fine tuning knob (unratcheted).

With the mandatory addition of UHF tuning capability to all new TV receiver sets, increased benefits flow from the accomplishment of the instant invention of eliminating the central shaft always found in prior tuners; for while the central shaft could be fairly effectively grounded as to VHF frequency signals) at least as long as the grounding component did not wear or become loose), in the higher UHF frequency range ground is far from adequate to prevent tuner component stray signals from passing through the central shaft to the receiver set antenna. Since the UHF frequencies greatly multiply the high frequency interference problems in tuner design, the shortening of leads and the maximal separation of components in tuners, according to the instant invention, provide corresponding improved performance.

FIGURE 6 shows a VHF-UHF tuner as illustrated in FIGURE 5 with control motors 20′ and 20″ substituted for the knobs 47′ and 47″ on the shafts 46′ and 46″. Such control motors act as rotary switches under the influence of pushbutton control input signals from either a remote location or the front panel of the TV receiver set, as at 70. The motors 20′ and 20″ may, of course, be mounted coplanar to the wafers and geared thereto as shown in FIGURE 1*b*. For minimum tuner thickness, one motor 20 at each end would then be preferred.

FIGURE 8 shows schematically an arrangement of the wafers 30–36 and the motor 20 different from the side-by-side arrangement heretofore discussed, but equally feasible according to the principles of the instant invention. Aside from spacing and design considerations, the most important aspect of the FIGURE 8 arrangement is that it permits maximum separation of the wafers 30–36 one from another.

FIGURE 9, on the other hand, shows an arrangement of three wafers and the motor 20 that minimizes the space occupied by the tuner.

Thus, applicant has achieved an improved television receiving set under usable in thin-designed television sets and featuring easily accessible and disassembled wafers bearing the tuner circuit components. The elimination of the large central shaft bearing all of the wafers of the tuner constitutes a substantial advance in eliminating the stray signal problem encountered with prior tuners and also cuts down the great frictional resistance to turning presented by many prior tuner shafts. Frictional resistance requiring great turning force on the knob of the shaft, its minimization by the present invention is especially important for the new UHF tuners, in which fine tuning without overshooting is essential. The large applied turning force required by most prior art tuners makes UHF fine tuning a painstaking process. It should be noted that the minimization of blacklash effects in the tuners according to applicant's invention will add even more to this fine tuning accuracy.

While only a limited number of embodiments have been disclosed herein, it will be readily apparent to persons skilled in the art that numerous changes nad modifications may be made without departing from the spirit of the invention. Accordingly, the foregoing disclosure is for illustrative purposes only and does not limit the invention which is defined only by the claims that follow.

What is claimed is:

1. A tuning mechanism for a television receiver constructed to receive a plurality of channels of TV broadcast signals and having an antenna, a picture tube, and electronic circuitry foh converting the TV signals received on the antenna into an input to operate the picture tube, including:

a plurality of rotatable circular wafers adjacent to one another in coplanar relationship, the wafers being made from a material having properties of providing electrical insulation;

circuit elements mounted on the wafers for tuning the electronic circuitry of the television receiver to a specific one of the plurality of channels to obtain the passage into the television receiver of the signals received on the antenna for the specific channel;

intermeshing gears on the peripheries of the wafers to obtain a synchronous rotation of the different wafers in the plurality;

means for obtaining electrical contact between the circuit elements on each wafer and the electronic circuitry of the television receiver in accordance with the rotary position of the wafer; and means for rotating one of the wafers in the plurality to obtain a synchronous rotation of the other wafers.

2. The tuning mechanism set forth in claim 1 wherein a shielding member is disposed between each adjacent pair of coplanar wafers to shield the circuit elements on each wafer from the circuit elements on the adjacent wafer.

3. A tuning mechanism for a television receiver having an antenna, a picture tube, and electronic circuitry for converting TV signals received on the antenna from a plurality of channels into an input to operate the picture tube in accordance with the visual information represented by the signals from a selected one of the channels in the plurality, including:

a plurality of rotatable circular wafers adjacent to one another in coplanar relationship, the wafers being made from a material having properties of providing electrical insulation;

circuit elements mounted on the circular wafers for tuning the selected one of the channels to obtain the conversion of the TV signals from the selected channel by the electronic circuitry;

intermeshing gears on the peripheries of the wafers to obtain a synchronous rotation of the different wafers in the plurality;

electrical contacts associated with the circuit elements on the wafers to establish electrical contact with these circuit elements in accordance with the rotary positions of the wafers;

slides notched to make and break electrical connection with the electrical contacts as the wafer is rotated to obtain the selection of one of the TV channels in accordance with the rotary positions of the wafers; and means for obtaining a rotation of one of the wafers to obtain corresponding rotations of the other wafers.

4. The tuning mechanism set forth in claim 3 wherein shielding means are disposed between each adjacent pair of coplanar wafers to shield electrically the circuit elements on each wafer from the circuit elements on the adjacent wafers.

5. A tuning mechanism for a television receiver having an antenna, a picture tube and electronic circuitry for converting TV signals received on the antenna from a plurality of different channels into an input to operate the picture tube, including:

a plurality of rotatable circular wafers mounted in coplanar and adjacent relationship to one another and having properties of providing electrical insulation;

circuit elements mounted on the wafers for obtaining a tuning to individual ones of the different channels in the plurality of the electronic circuitry of the television receiver;

intermeshing gears on the peripheries of the wafers for synchronously rotating the wafers;

first electrical contact means associated with the circuit elements on the wafers to establish electrical continuity with these circuit elements;

second electrical contact means constructed and disposed relative to the first contact means to make and break electrical contact with the first contact means as the wafers are rotated; and means for rotating one of the wafers to obtain corresponding rotations of the other wafers.

6. The tuning mechanism set forth in claim 5 wherein shielding means are disposed between adjacent pairs of wafers to shield electrically the circuit elements on each wafer from the circuit elements on the other wafers.

7. A tuning mechanism for a television receiver having an antenna, a picture tube, a plurality of different TV channels and electronic circuitry for converting TV signals received on the antenna for the various channels into an input to operate the picture tube, including:

a plurality of rotatable circular wafers mounted in coplanar and adjacent relationship to one another and provided with properties of electrical insulation;

circuit elements mounted on the wafers to obtain the selective tuning of the electronic circuitry to individual ones of the TV channels in accordance with the rotation of the wafers;

intermeshing gears on the peripheries of the wafers to obtain a synchronous rotation of the wafers;

first electrical contact means electrically connected to the circuit elements on the wafers and disposed on the wafers for rotation with the wafers;

second electrical contact means disposed relative to the first electrical contact means to make and break electrical contact with the first electrical contact means as the wafers are rotated;

means for rotating a particular one of the wafers to obtain corresponding rotations of the other wafers to effect tuning of the electronic circuitry to individual ones of the TV channels; and electrical shields mounted between adjacent wafers to shield the circuit elements on each wafer from the circuit elements in the other wafers, the electrical shields being slotted, the slots in the shields being positioned to permit intermeshing of the gears of the wafers.

8. The tuning mechanism set forth in claim 7 wherein a control motor is coupled to the particular one of the wafers to effect tuning of the electronic circuitry to the individual ones of the TV channels.

9. A combined VHF–UHF tuning mechanism for a television receiver having an antenna, a picture tube, a plurality of different VHF and UHF TV channels, and electronic circuitry for converting TV signals received on the antenna for the different channels into an input to operate the picture tube including:

first and second parallel rows of rotatable wafers, the wafers in each row being adjacent to one another and being coplanar;

first circuit elements mounted on the wafers of the first row for tuning the electronic circuitry to the different VHF channels of the television receiver in accordance with the rotation of the wafers;

second circuit elements mounted on the wafers of the second row for tuning the electronic circuitry to the different UHF channels in accordance with the rotation of the wafers of the television receiver;

first intermeshing gears on the peripheries of the wafers in the first row for obtaining synchronous rotation of these wafers;

second intermeshing gears on the peripheries of the wafers in the second row for obtaining synchronous rotation of the wafers;

means for effecting rotation-variable electrical contact between the circuit elements on each wafer and the electronic circuitry of the television receiver in accordance with the rotary position of the wafers;

first means for synchronously rotating the wafers in the VHF row; and second means for synchronously rotating the wafers in the UHF row to obtain corresponding rotations of the other wafers in the individual one of the VHF and UHF rows.

10. The mechanism set forth in claim 9 wherein the first and second means include a pair of coaxial shafts, one of the shafts being mechanically coupled to at least one of the wafers in the first parallel row and the other shaft being mechanically coupled to at least one of the wafers in the second parallel row.

11. The mechanism set forth in claim 10 wherein a plurality of electrical shields are provided each disposed between a different pair of wafers to shield the circuit elements on one of the wafers in the pair from the circuit elements on the other wafer in the pair.

12. A tuning mechanism for a television receiver having an antenna, a picture tube, and electronic circuitry for converting TV signals received on the antenna from a plurality of channels into an input to operate the picture tube comprising:

a first rotatable circular wafer provided with properties of electrical insulation;

a gear around the periphery of the first circular wafer;

a second rotatable circular wafer provided with properties of electrical insulation and disposed in coplanar relationship with the first rotatable circular wafer;

a gear around the periphery of the second circular wafer, the second wafer being so located relative to the first wafer that the gear of the second wafer meshes with the gear of the first wafer;

a third rotatable circular wafer provided with properties of electrical insulation and disposed in coplanar relationship with the first and second rotatable circular wafers;

a gear around the periphery of the third circular wafer, the third circular wafer being so located relative to the second circular wafer that the gear of the third wafer meshes with the gear of the second wafer;

tuning components mounted on the first, second and third wafers for tuning the electronic circuitry of the television receiver to individual ones of the TV channels in accordance with the rotation of the wafers;

contacts mounted on the wafers for rotation with the wafers and electrically coupled to the tuning components to energize the tuning components in accordance with the rotation of the wafers;

slides disposed adjacent to the contacts to establish an electrical connection between the contacts on each wafer and the slides in accordance with the rotation of the wafers; and means for imparting rotation to a particular one of the wafers to obtain synchronous rotation of the other wafers.

13. The tuning mechanism set forth in claim 12 wherein a first electrical shield is disposed between the first and second wafers to shield the tuning components on the first wafer from the tuning components on the second wafer and wherein a second electrical shield is disposed between the second and third wafers to shield the tuning components on the second wafer from the tuning components on the third wafer.

14. The tuning mechanism set forth in claim 13 wherein a motor is mechanically coupled to a particular one of the gears to rotate the gears.

15. A tuning mechanism for a television receiver having an antenna, a picture tube, and electronic circuitry for converting the TV signals received on the antenna into an input to operate the picture tube comprising: a base, a first wafer shaft mounted on the base, a first circular wafer mounted rotatably on the first shaft, gears around the periphery of the first circular wafer, a second wafer shaft mounted on the base, a second circular wafer mounted rotatably on the second shaft, gears around the periphery of the second circular wafer, the second wafer being so located relative to the first wafer that the gears of the second wafer mesh with the gears of the first wafer, a third wafer shaft mounted on the base, a third circular wafer mounted rotatably on the third shaft, gears around the periphery of the third circular wafer, the third circular wafer being so located relative to the second circular wafer that the gears of the third wafer mesh with the gears of the second wafer, a fourth wafer shaft mounted on the base, a fourth circular wafer mounted rotatably on the fourth shaft, gears around the periphery of the fourth circular wafer, the fourth wafer being so located relative to the third wafer that the gears on the fourth wafer mesh with the gears of the third wafer, tuning components for tuning the electronic circuitry of the television receiver to one specific desired TV channel mounted on the wafers, contacts mounted on each of the above-described wafers and electrically coupled to the tuning components, slides electrically coupled to the electronic circuitry of the television receiver and mounted on said shafts in such position that upon rotation of the wafers an electrical connection between a contact on each wafer and a slide may occur, an electric motor mounted on the base and connected to impart rotation to one of the wafers to effect corresponding rotations of other wafers such that the tuning components thereon are electrically coupled to tune the electronic circuitry to the specific desired TV channel, and shielding between adjacent wafers with gaps therein to permit intermeshing of the gears of said adjacent wafers.

References Cited

UNITED STATES PATENTS

| | | | |
|---|---|---|---|
| 2,557,234 | 6/1951 | Reith | 334—49 |
| 2,807,724 | 9/1957 | Felt | 334—49 |
| 3,015,705 | 1/1962 | Dull | 200—153.16 |

ELI LIEBERMAN, *Primary Examiner.*

HERMAN KARL SAALBACH, *Examiner.*

R. F. HUNT, P. L. GENSLER, *Assistant Examiners.*